(12) United States Patent
Galbraith et al.

(10) Patent No.: US 10,937,510 B2
(45) Date of Patent: Mar. 2, 2021

(54) MULTIDIMENSIONAL PSEUDORANDOM BINARY SEQUENCE ANALYSIS FOR A MEMORY DEVICE

(71) Applicant: Western Digital Technologies, Inc., San Jose, CA (US)

(72) Inventors: Richard Galbraith, San Jose, CA (US); Jonas Goode, San Jose, CA (US); Henry Yip, San Jose, CA (US); Ravi Kumar, San Jose, CA (US); Niranjay Ravindran, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/456,522

(22) Filed: Jun. 28, 2019

(65) Prior Publication Data
US 2020/0411121 A1 Dec. 31, 2020

(51) Int. Cl.
*G11C 16/34* (2006.01)
*G06F 3/06* (2006.01)
*G11C 11/4091* (2006.01)
*G06F 7/58* (2006.01)

(52) U.S. Cl.
CPC .......... *G11C 16/3404* (2013.01); *G06F 3/064* (2013.01); *G06F 3/0619* (2013.01); *G06F 3/0679* (2013.01); *G06F 7/582* (2013.01); *G11C 11/4091* (2013.01)

(58) Field of Classification Search
CPC .................................................. G11C 16/3404
USPC ..................................................... 365/185.24
See application file for complete search history.

(56) References Cited

U.S. PATENT DOCUMENTS

| | | | |
|---|---|---|---|
| 5,440,640 A * | 8/1995 | Anshel | H04L 9/0656 380/46 |
| 6,549,446 B2 | 4/2003 | Morley et al. | |
| 7,885,112 B2 | 2/2011 | Li et al. | |
| 8,130,955 B2 | 3/2012 | Trichina et al. | |
| 8,873,286 B2 * | 10/2014 | Strasser | G11C 11/56 365/185.03 |
| 9,323,499 B2 | 4/2016 | Hyde et al. | |
| 2006/0062048 A1 * | 3/2006 | Gonzalez | G06F 11/1068 365/185.11 |

(Continued)

OTHER PUBLICATIONS

H.C. Torng, "On implication graph and state splitting," Proceedings of the IEEE, vol. 53, Issue 12, Dec. 1965, p. 2137.

(Continued)

*Primary Examiner* — Muna A Techane
(74) *Attorney, Agent, or Firm* — Dickinson Wright PLLC; Steven Hurles

(57) ABSTRACT

A method for identifying cell coupling in a memory system includes generating a two-dimensional pseudorandom binary sequence array. The method also includes performing an erase operation on a plurality of cells of a memory block of the memory system. The method also includes performing a write operation on the plurality of cells using the two-dimensional pseudorandom binary sequence array. The method also includes performing a read operation on the plurality of cells to identify a voltage value for each cell of the plurality of cells. The method also includes identifying cell coupling between respective cells of the plurality of cells using the voltage value for each of the cells of the plurality of cells.

20 Claims, 9 Drawing Sheets

(56) References Cited

U.S. PATENT DOCUMENTS

| | | | |
|---|---|---|---|
| 2012/0233523 A1* | 9/2012 | Krishnamoorthy ... | H03M 13/05 |
| | | | 714/758 |
| 2015/0179275 A1* | 6/2015 | Patel ................... | G11C 29/025 |
| | | | 365/185.17 |
| 2015/0213872 A1* | 7/2015 | Mazumder ........ | G11C 11/40611 |
| | | | 365/218 |

OTHER PUBLICATIONS

F. Jessie MacWilliams, et al., "Pseudo-Random Sequences and Arrays," Proceedings of the IEEE, vol. 64, No. 12, Dec. 1976, pp. 1715-1729.

Jaewon Cha, et al., "Low Cost Endurance Test-pattern Generation for Multi-level Cell Flash Memory," Journal of Semiconductor Tech. and Science, vol. 17, No. 1, Feb. 2017, pp. 147-155.

Yu Cai, et al., "Error Pattern in MLC NAND Flash Memory: Measurement, Characterization, and Analysis," Dept. of Electrical and Computer Engineering, Carnegie Mellon Univ., 978-3-9810801-8-6/Date12/©2012 EDAA.

* cited by examiner

1D-PRBS Indexes (deg 4) written as 1*15 atomic array

| 0 | 1 | 2 | 3 | 4 | 5 | 6 | 7 | 8 | 9 | 10 | 11 | 12 | 13 | 14 |

2D-PRBS Indexes (deg 4) written as 3*5 atomic array

| 0 | 6 | 12 | 3 | 9 |
| 10 | 1 | 7 | 13 | 4 |
| 5 | 11 | 2 | 8 | 14 |

2D-PRBS Indexes (deg 4) written as 15*15 atomic array

| 0 | 1 | 2 | 3 | 4 | 5 | 6 | 7 | 8 | 9 | 10 | 11 | 12 | 13 | 14 |
| 4 | 5 | 9 | 3 | 8 | 9 | 10 | 11 | 12 | 13 | 14 | 0 | 1 | 2 | 3 |
| 8 | 9 | 13 | 7 | 12 | 13 | 14 | 0 | 1 | 2 | 3 | 4 | 5 | 6 | 7 |
| 12 | 13 | 2 | 11 | 1 | 2 | 3 | 4 | 5 | 6 | 7 | 8 | 9 | 10 | 11 |
| 1 | 2 | 6 | 0 | 5 | 6 | 7 | 8 | 9 | 10 | 11 | 12 | 13 | 14 | 0 |
| 5 | 6 | 10 | 4 | 9 | 10 | 11 | 12 | 13 | 14 | 0 | 1 | 2 | 3 | 4 |
| 9 | 10 | 14 | 8 | 13 | 14 | 0 | 1 | 2 | 3 | 4 | 5 | 6 | 7 | 8 |
| 13 | 14 | 3 | 12 | 2 | 3 | 4 | 5 | 6 | 7 | 8 | 9 | 10 | 11 | 12 |
| 2 | 3 | 7 | 1 | 6 | 7 | 8 | 9 | 10 | 11 | 12 | 13 | 14 | 0 | 1 |
| 6 | 7 | 11 | 5 | 10 | 11 | 12 | 13 | 14 | 0 | 1 | 2 | 3 | 4 | 5 |
| 10 | 11 | 0 | 9 | 14 | 0 | 1 | 2 | 3 | 4 | 5 | 6 | 7 | 8 | 9 |
| 14 | 0 | 4 | 13 | 3 | 4 | 5 | 6 | 7 | 8 | 9 | 10 | 11 | 12 | 13 |
| 3 | 4 | 8 | 2 | 7 | 8 | 9 | 10 | 11 | 12 | 13 | 14 | 0 | 1 | 2 |
| 7 | 8 | 12 | 6 | 11 | 12 | 13 | 14 | 0 | 1 | 2 | 3 | 4 | 5 | 6 |
| 11 | 12 | 1 | 10 | 0 | 1 | 2 | 3 | 4 | 5 | 6 | 7 | 8 | 9 | 10 |

Linear Coupling to Vertical

MULTIDIMENSIONAL PSEUDORANDOM BINARY SEQUENCE ANALYSIS FOR A MEMORY DEVICE

TECHNICAL FIELD

This disclosure relates to memory systems and in particular to a multidimensional pseudorandom binary sequence analysis for the memory system.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

During performance of write operations on memory cells of such a memory system, voltage (e.g., representing data being stored in the memory cells) is applied to the memory cells. In typical memory systems, a memory cell may influence a voltage (e.g., cause the voltage of the other memory cell to increase or decrease) of another memory cell that is relatively close to memory cell (e.g., adjacent to the memory cell). This may be referred to as cell coupling and may occur in a number of abject memory cells in a memory block being written to (e.g., as part of the write operation). Such cell coupling may make result inaccurate data reads (e.g., during performance of a read operation on the memory cells) and/or may decrease performance of the memory system in general. Additionally, as the complexity of memory systems continue to increase, such as by including multi-level memory cells (e.g., 2 or more bits/cell), triple-level memory cells (e.g., 3-bits/cell), quad-level memory cells (e.g., 4-bits/cell), and the like, cell coupling may increase, which may be increasingly undesirable.

SUMMARY

This disclosure relates generally to memory management systems and methods.

An aspect of the disclosed embodiments is a method for identifying cell coupling in a memory system. The method includes generating a two-dimensional pseudorandom binary sequence array. The method also includes performing an erase operation on a plurality of cells of a memory block of the memory system. The method also includes performing a write operation on the plurality of cells using the two-dimensional pseudorandom binary sequence array. The method also includes performing a read operation on the plurality of cells to identify a voltage value for each cell of the plurality of cells. The method also includes identifying cell coupling between respective cells of the plurality of cells using the voltage value for each of the cells of the plurality of cells.

Another aspect of the disclosed embodiments is a controller that includes a bus interface and a processor. The bus interface is in communication with one or more memory blocks of a memory system. The processor is configured to: receive a two-dimensional pseudorandom binary sequence array; perform an erase operation on a plurality of cells of a memory block of the one or more memory blocks; perform a write operation on the plurality of cells using the two-dimensional pseudorandom binary sequence array; perform a read operation on the plurality of cells to identify a voltage value for each cell of the plurality of cells; and identify cell coupling between respective cells of the plurality of cells using the voltage value for each of the cells of the plurality of cells.

Another aspect of the disclosed embodiments is a system for identifying cell coupling in a memory system. The system includes at least one memory block and a controller. The controller is in communication with the at least one memory block and includes a pseudorandom binary sequence generator configured to generates a two-dimensional pseudorandom binary sequence array. The controller also includes a cell coupling detector configured to: perform an erase operation on a plurality of cells of the at least one memory block; perform a write operation on the plurality of cells using the two-dimensional pseudorandom binary sequence array; perform a read operation on the plurality of cells to identify a voltage value for each cell of the plurality of cells; and identify cell coupling between respective cells of the plurality of cells using the voltage value for each of the cells of the plurality of cells.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
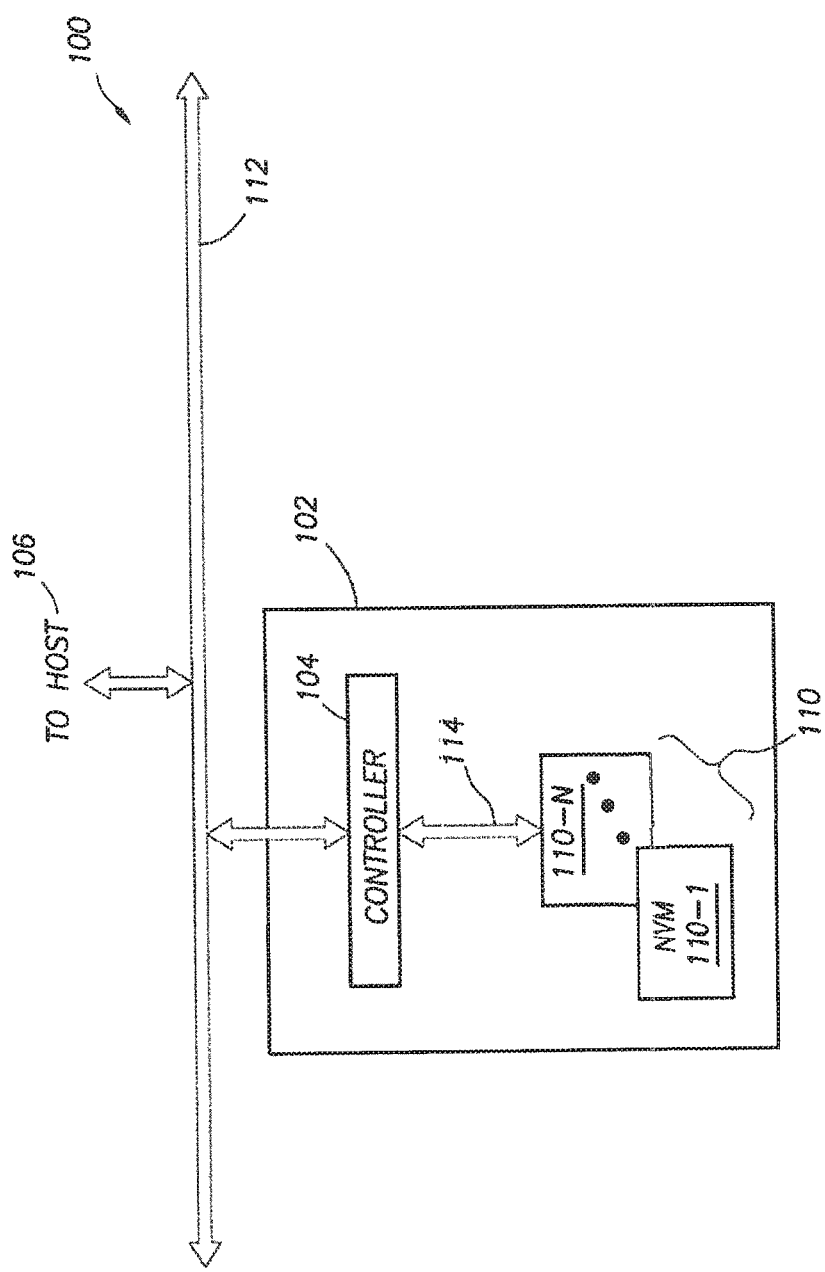
FIGS. 1A-1B generally illustrates a block diagram of an example non-volatile memory system according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

During performance of write operations on memory cells of such a memory system, voltage (e.g., representing data being stored in the memory cells) is applied to the memory cells. In typical memory systems, a memory cell may influence a voltage (e.g., cause the voltage of the other memory cell to increase or decrease) of another memory cell that is relatively close to memory cell (e.g., adjacent to the memory cell). This may be referred to as cell coupling and may occur in a number of abject memory cells in a memory block being written to (e.g., as part of the write operation). Such cell coupling may make result inaccurate data reads (e.g., during performance of a read operation on the memory cells) and/or may decrease performance of the memory system in general. Additionally, as the complexity of memory systems continue to increase, such as by including multi-level memory cells (e.g., 2 or more bits/cell), triple-level memory cells (e.g., 3-bits/cell), quad-level memory cells (e.g., 4-bits/cell), and the like, cell coupling may increase, which may be increasingly undesirable.

Accordingly, it may be desirable to identify and correct such cell coupling by modeling the dynamic operation and performance of the memory system. Further, it may be desirable to isolate and decompose cell coupling effects during the performance of write operations, read operations, retention, and the like. Such cell coupling effects may include: linear and non-linear coupling effects that occur during the performance of write operations; linear and non-linear coupling effects that occur during retention; linear and non-linear coupling effects that occur during the performance of read operations; and the like.

A typical memory system may use methods of analysis that include writing simple repeated patterns to memory cells of the memory system and identifying expected deviations that can occur due to known deficiencies in the memory cells. Alternatively, another method may include writing statistically random data to the memory cells and using statistical observations in order to arrive at certain conclusions based on random statistics.

In other areas of design and engineering, including signal processing, communications, dynamic mechanical systems, and the like, a set of mathematical tools configured to analyze a dynamic system have been developed. These analysis methods, which may include pseudorandom binary sequence methods, for the most part, have not been adapted for use with the design of modern memory systems. For example, the tools of signal processing used in hard disk device (HDD) design are not configured for use in memory systems, such as NAND flash memory systems and the like, because such memory systems do not output an analog signal similar to that of a read head in an HDD device.

As described, such analysis methods include using pseudorandom binary sequence (PRBS) arrays (e.g., sometimes referred to as patterns). PRBS arrays may be generated with linear feedback shift register (LFSR) or other suitable PRBS generation device. For example, the LFSR may generate a finite field alphabet (e.g., $\{0, \alpha^0 \ldots \alpha^{14}\}$, $\{0, \alpha^0 \ldots \alpha^{62}\}$, or other suitable alphabet). Each element (e.g., letter) of the alphabet includes N-bits for a Degree-N polynomial and the total number of non-zero elements is $2^N+1$. Accordingly, operations (e.g., plus, minus, multiply, divide, and the like) in $GF(2^N)$ results in an element of the field. The non-zero elements are labeled $\alpha^x$ where $X=0 \ldots (2^N-2)$. The resulting PRBS includes indexes corresponding to exponents (e.g., $\{0 \ldots 14\}$, $\{0 \ldots 62\}$, or other suitable exponents depending on the dimensions of the PRBS) of the elements of the alphabet generated by the LFSR. This may be referred to as the log domain. Generating a PRBS array using an LFSR may provide a relatively efficient method for generating PRBS arrays. A PRBS array typically has a spectrally flat response (e.g., except DC), which indicates the random nature of the PRBS array. Additionally, or alternatively, a PRBS array typically has special characteristics or properties, such as shift properties, recurrence properties, window properties, half 1's half 0's properties, addition properties, shift-and-add properties, autocorrelation functions, runs properties, and/or other suitable characteristics or properties.

In addition to the above characteristics or properties, a PRBS array may provide for a two-valued autocorrelation as 1D or nD array, may be suitable for system identification allowing isolation of linear and non-linear kernels, and may provide simple deconvolution using straightforward cross-correlation of a read pattern with the signed PRBS sequence.

Accordingly, systems and methods, such as those described herein, that are configured to use PRBS sequence arrays, and in particular, multidimensional PRBS sequence arrays, to identify cell couplings in a memory system, such as a NAND flash memory system, may be desirable. In some embodiments, the systems and methods described herein may be configured to adapt multidimensional PRBS analysis for the memory system (e.g., having 3D-NAND memory) by selecting a desired storage configuration for memory cells.

Figure 5A:
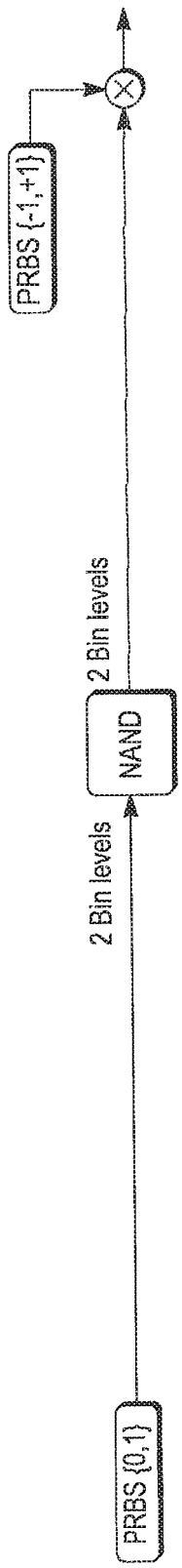
FIGS. 5A-5C generally illustrate memory cell storage configurations according to the principles of the present disclosure.
Figure 5B:
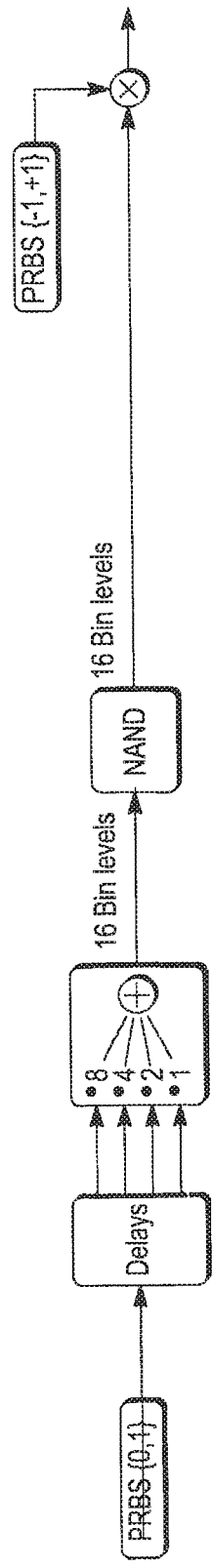
Figure 5C:
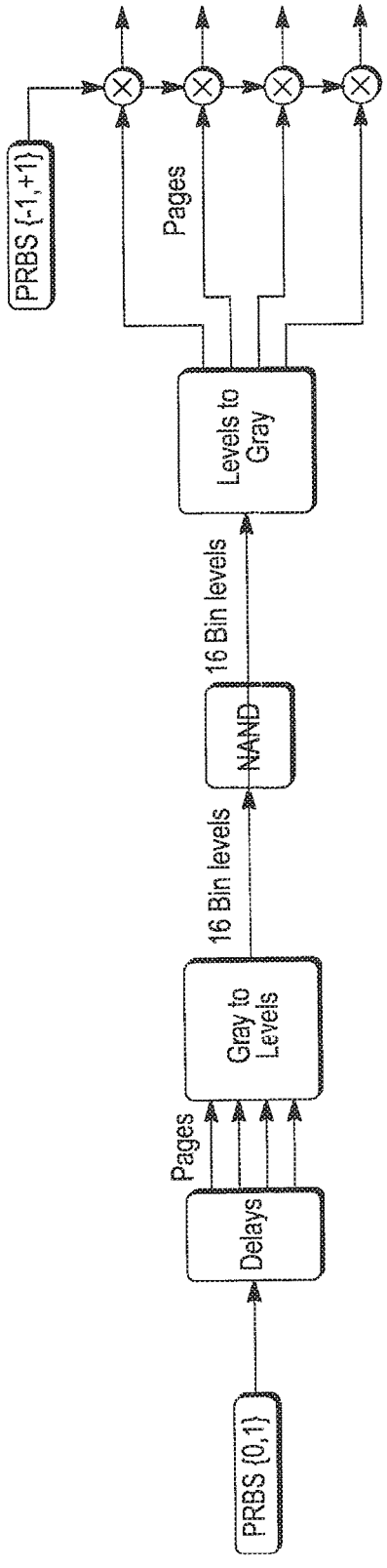

In some embodiments, two voltage levels may be stored in each memory cell. FIG. 5A generally illustrates a two-level PRBS writing pattern (e.g., without using gray code of the memory system). In some embodiments, a full spectrum of programmable levels may be used for the memory cells. For example, as is generally illustrated in FIG. 5B, a 16-level (e.g., 4-bit/cells) PRBS writing pattern (e.g., without using gray code of the memory system) may provide additional possible dynamic modes of operation of the memory system. FIG. 5C, generally illustrates an alternative 16-level (e.g., 4-bits/cell) PRBS writing pattern that uses the gray code that typically exists in the memory data path. Each PRBS writing pattern provide various benefits for the overall analysis. Additionally, or alternatively, single reads per threshold or Vt distributions may be used to form a pseudo analog signal for deconvolution.

Figures 6A, 6B, 6C, 6D:
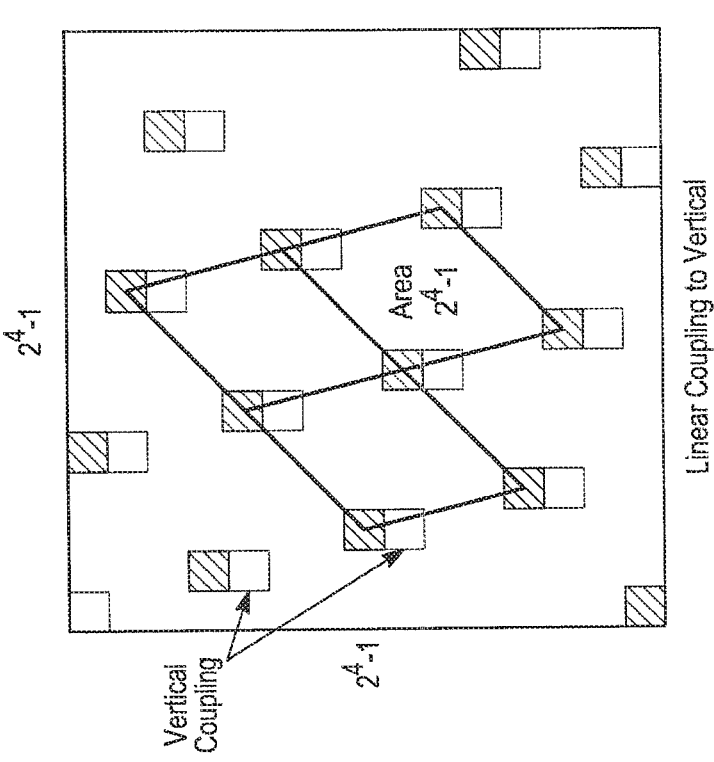
FIGS. 6A-6C generally illustrate pseudorandom binary sequence arrays according to the principles of the present disclosure.
FIG. 6D generally illustrates vertical cell couplings according to the principles of the present disclosure.

In some embodiments, the systems and methods described herein may be configured to select a PRBS array layout that fits with the memory cell (e.g., 3D NAND) structure. PRBS sequences must be cross-correlated (deconvolved) using whole multiples of the atomic PRBS array size (e.g., the minimum size). FIGS. 6A-6C generally illustrate various PRBS array structures. The cross-correlation process occur in whole multiples of the illustrate structures.

FIG. 6A generally illustrates a linear method comprising a 1D array structure that is typically used in HDD analysis.

This may be referred to as a traditional 1D PRBS sequence array and may be generated with a simple LFSR using a primitive polynomial (e.g., x4+x+1)

FIG. 6B generally illustrates a rectangle method, which may be a very compact array structure. However, the rectangle method may not provide adequate randomness along each row and column of the structure.

FIG. 6C generally illustrates a parallelogram method comprising a relatively larger atomic array structure. The parallelogram method provides the benefit of having adequate randomness along each individual row and column of the structure. As is generally illustrated, the highlighted parallelograms in the parallelogram method structure encapsulates all the elements of the PRBS sequence and the cross-correlation results repeat according to the vertices of the parallelogram. The PRBS array may include any suitable array defined by degree–$N(2^N-1)$=array length). For example, the PRBS array illustrated in FIG. 6C includes as 15 by 15 array, where all 15 elements (e.g., 0-14) are included in each row and each column and appear only once in each row and each column. This may be referred to as the Latin Square property.

In some embodiments, a parallelogram 2D PRBS array may include a 63 by 63 (not shown) array having indexes (degree 6) written as a 63*63 atomic array. The indexes in the horizontal rows increment by 1 mod 63 from left to right. The indexes in the vertical columns increment by 11 mod 63 from bottom to top (referred to as a decimation=11). Each row and each column contain all 63 values (0 to 62) exactly once, as described with respect to the 15 by 15 array. As described, the PRBS includes indexes corresponding to exponents (e.g., {0 . . . 62}) of the elements of the finite field alphabet generated by the LFSR. Such a PRBS array may include a number of possible decimation values and may be optimized for placement of non-linear echoes (e.g., resulting from cell couplings), as is generally illustrated in FIG. 6D. A location of linear echoes may always be consistent with the physical cell coupling orientation. For example, a linear signal-coupling echo between cells may be identifiable as a physical interpretation because it appears as a shift in the log domain of the field. Additionally, or alternatively, a location of a non-linear echo may be determined by bit-wise addition (XOR) of the field values corresponding to the two coupled cells corresponding to the echo, which may not appear as a simple shift in the log domain. PRBS sequence arrays.

In some embodiments, the systems and methods described herein may be configured to write the PRBS array into the memory cells with a predefined spacing assignment, such that the PRBS array is compacted into a honeycomb/string structure of the memory cells. For example, in order to fit the PRBS array tightly into the honeycomb structure and isolate a string region, the PRBS array may be spaced (expanded) such that every 4th bit in a wordline and 4th wordline is written with the PRBS array. This may allow the PRBS array to be compacted into the honeycomb/string structure of the memory cells.

In some embodiments, the systems and methods described herein may be configured to provide a practical and highly efficient mathematical approach to isolate and decompose linear and non-linear cell couplings during the writing/retention/reading process of the memory system.

In some embodiments, the systems and methods described herein may be configured to provide critical value by fitting with the memory cell structure. In addition, the systems and methods described herein may provide necessary orthogonality in modern memory cell structures to allow decomposition of cell couplings in the various dimensions of the memory cells.

In some embodiments, the systems and methods described herein may be configured to indicate all linear and non-linear coupling effects in the memory cells. At least some of these effects may be anticipated or known, but others may be unanticipated. The systems and methods described herein may be configured to allow the discovery of new cell coupling effects that were previously unknown.

The systems and methods described herein may be highly practical because of the written pattern being easily generated by an LFSR. Additionally, or alternatively, the systems and methods described herein may provide a relatively efficient deconvolution requiring a straightforward cross-correlation of the read pattern with the signed PRBS sequence. The systems and methods described herein may use PRBS sequences that include a deterministic flat spectrum with an exact equal number of 0s and 1s, which may improve accuracy of testing and which may identify cell coupling over the noise floor.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the controller 104 may receive commands or instructions from the host 106 and may perform read operations, write operations, programming operations, erase operations, other suitable operations, or a combination thereof on the memory of the storage system 102 in response to the commands or instructions communicated by the host 106. The host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC or 1-bit/cell), multiple-level cells (MLC or 2-bits/cell), triple-level cells (TLC or 3-bits/cell), or quad-level cells (QLC or 4-bits/cell). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

Figure 1B:
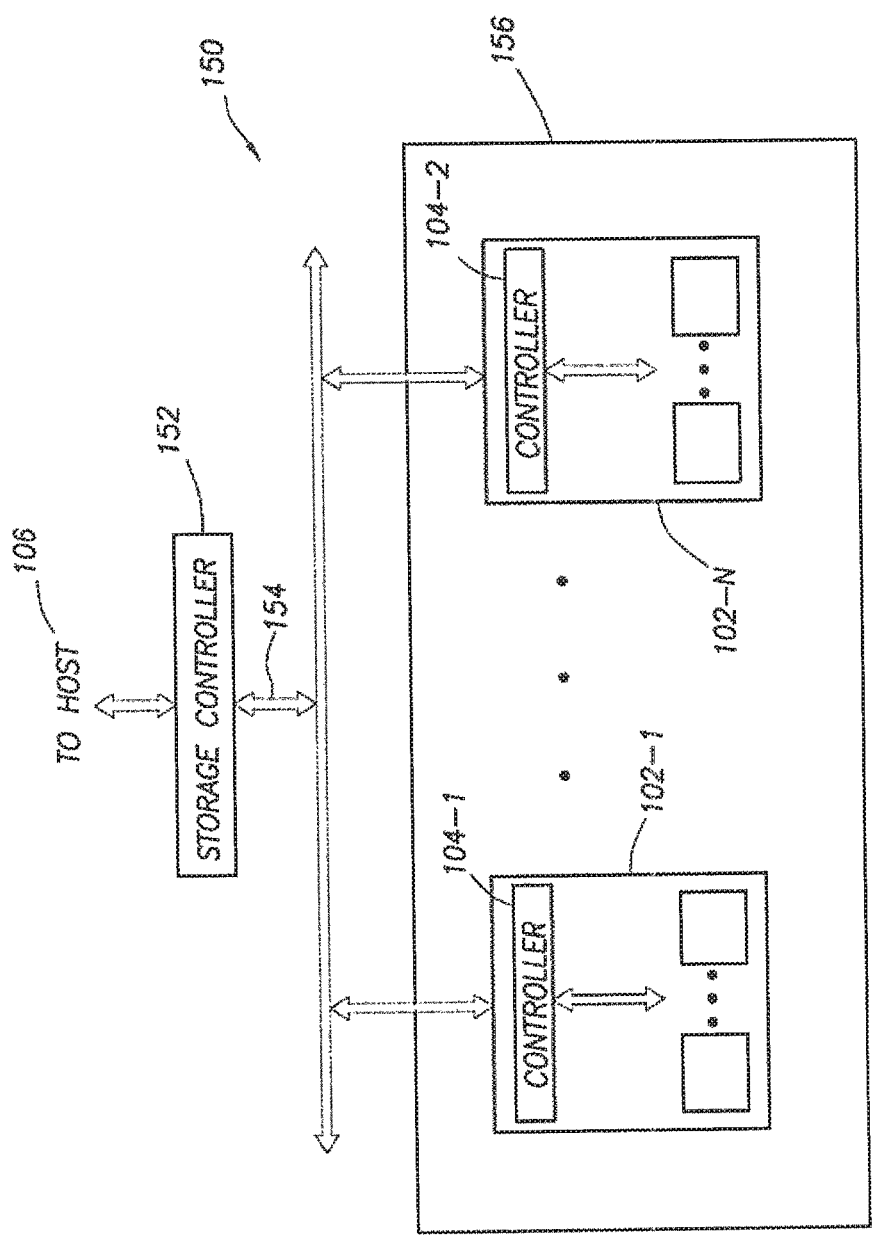

FIG. 1B generally illustrates a block diagram of the system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
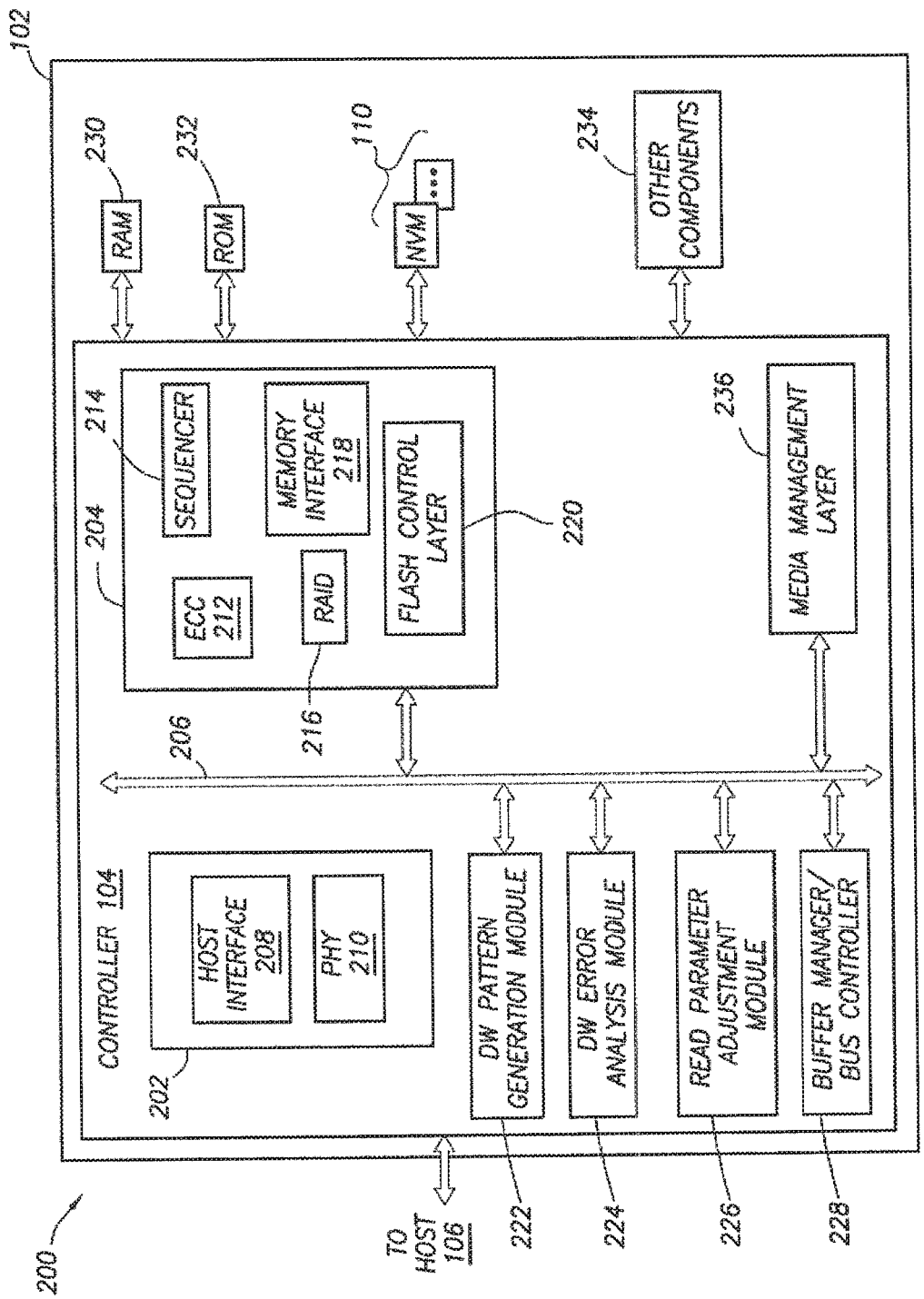
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
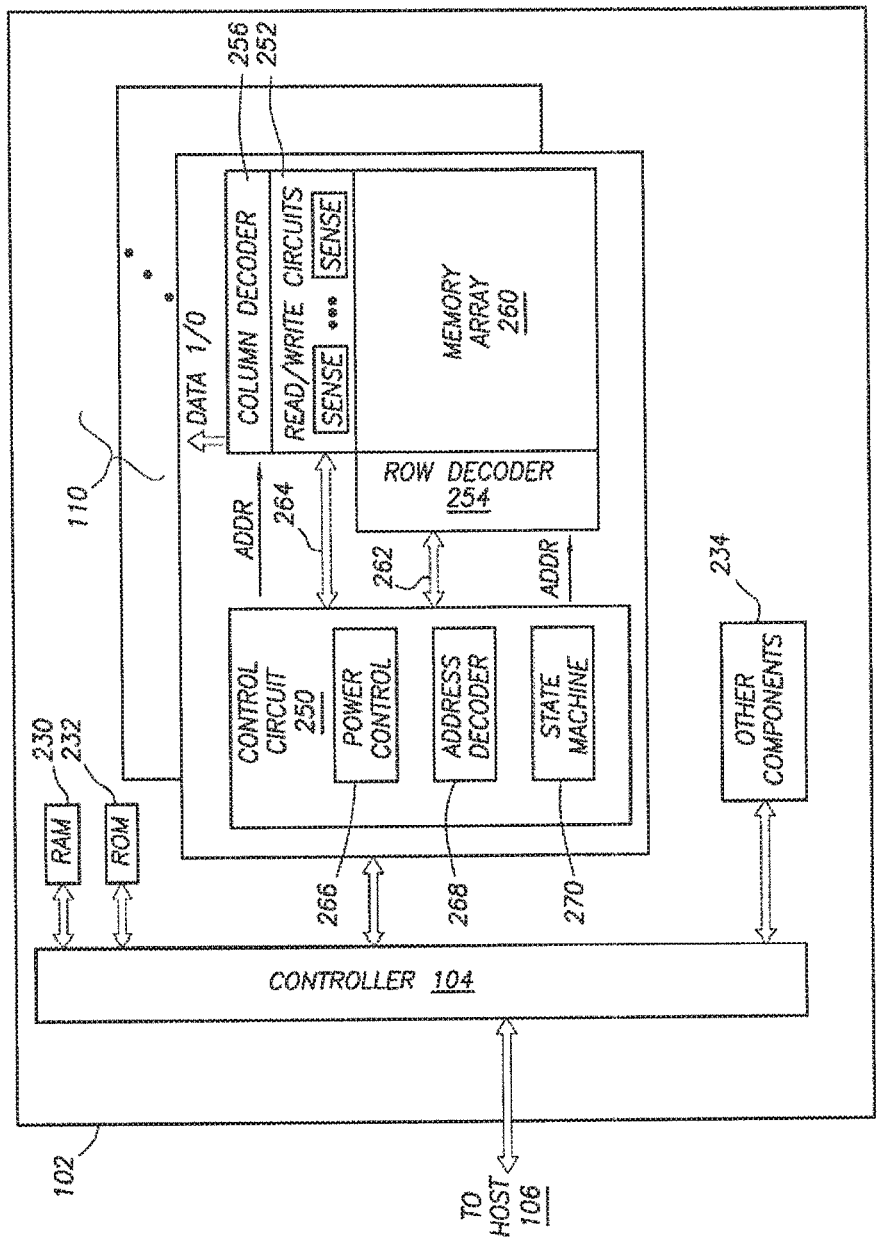
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
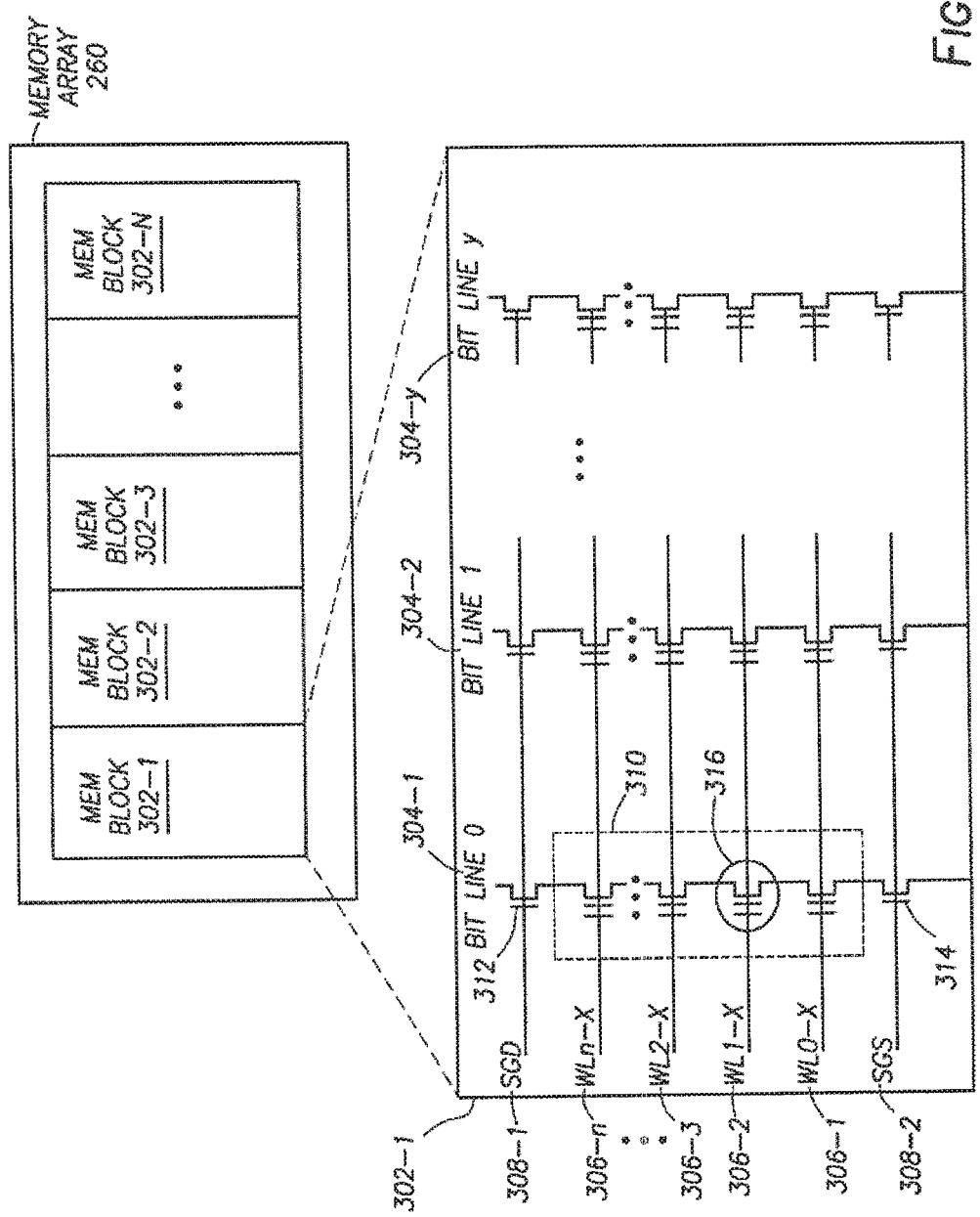
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 310 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

Figure 4:
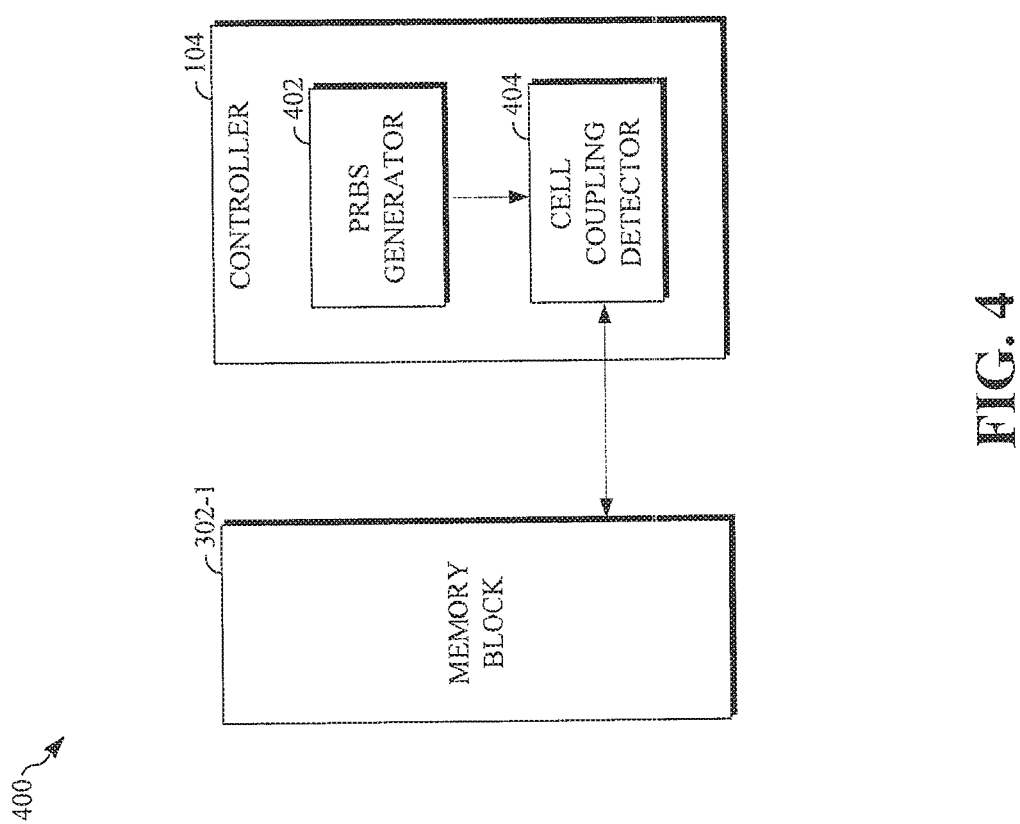
FIG. 4 generally illustrates a cell coupling detection system according to the principles of the present disclosure.

As described, the controller 104 may be configured to identify or detect cell couplings in memory cells one or more memory blocks 302-1 to 302-N. The controller 104 may include features in addition to or alternatively to those described above. For example, FIG. 4 generally illustrates a cell coupling detection system 400 including a memory block, such as the memory block 302-1 (e.g., or other suitable memory block of the memory blocks 302-1 to 302-N, or other suitable memory block) and a controller, such as the controller 104. The memory block 302-1 may include a plurality of memory cells, as described. The memory cells may include single-level cells, multi-level cells (e.g., 2 or more bits/cell, where $2^{n(bits/cell)}$=level of bits per cell), triple-level cells (e.g., 3-bits/cell), quad-level cells (e.g., 4-bits/cell), or other suitable memory cells.

The controller 104 may include a pseudorandom binary sequence (PRBS) generator 402 and a cell coupling detector 404. The PRBS generator 402 may include a linear feedback shift register (LFSR), or other suitable PRBS generator. The PRBS generator 402 is configured to generate a multidimensional (e.g., two-dimensional or other suitable multidimensional) PRBS array suitable for use in detecting cell couplings in the memory cells of the memory block 302-1. For example, the PRBS generator 402 may be configured to use the parallelogram method, as described, to generate a PRBS array having characteristics of those generally illustrated in FIG. 6C. For example, while FIG. 6C illustrates a 15 by 15 array, the PRBS generator 402 may generate a 63 by 63 array, as described, or other suitable array having any suitable size. The PRBS generator 402 may generate the PRBS array to include the Latin Square property, as described. For example, the PRBS array includes a plurality of rows and columns. Each row of the PRBS array includes all possible elements of the PRBS array exactly once. Similarly, each column of the PRBS array includes all possible elements of the PRBS array exactly once. For example, each row includes each element 0-62 exactly once and each column includes each element 0-62 exactly once. The PRBS generator 402 communicates the PRBS array to the cell coupling detector 404. In some embodiments, the PRBS generator 402 may be located remote from the controller 104. Accordingly, the controller 104 may receive the PRBS array from a remotely located computing device configured to execute the PRBS generator 402 or other suitable PRBS generator.

The cell coupling detector 404 is configured to detect or identify cell couplings in the memory cells of the memory block 302-1. The cell coupling detector 404 (e.g., or other components of the controller 104) is configured to perform an erase operation on a memory cells of a memory block 302-1. This may place the memory cells of the memory block 302-1 in a ready to program state and may charge each of the memory cells to an erased voltage.

The cell coupling detector 404 (e.g., or other components of the controller 104) is configured to perform a write operation on memory cells of the memory block 302-1 using the PRBS array. For example, the cell coupling detector 404 may charge respective memory cells of the memory block 302-1 with voltage that corresponds to respective elements of the PRBS array. This may provide a random data write to the respective memory cells of the memory block 302-1.

The cell coupling detector 404 (e.g., or other components of the controller 104) is configured to perform a read operation on the respective memory cells of the memory block 302-1. The cell coupling detector 404 receives output from the read operation form the memory block 302-1. The output includes a voltage value (e.g., the read voltage, indicating the data stored in the respective memory cell) for each respective memory cell.

The cell coupling detector 404 is configured to identify cell couplings between respective memory cells using the voltage value for each of the respective memory cell, the PRBS array, other suitable information or memory cell characteristics, or a combination thereof. For example, the cell coupling detector 404 may compare the voltage value for a respective memory cell with an expected voltage value. The expected voltage value may correspond to an element of the PRBS array used to program (e.g., write data to) the respective memory cell. Additionally, or alternatively, the cell coupling detector 404 may be configured to identify the cell couplings in any suitable manner. As described, the detected cell couplings may be linear or non-linear cell couplings.

The cell coupling detector 404 may be configured to identify a location of a respective cell coupling using the voltage value for each of the respective memory cell, the PRBS array, other suitable information or memory cell characteristics, or a combination thereof. For example, the cell coupling detector 404 may be configured to identify a location of a cell coupling between two respective memory cells by using a known location of the two memory cells. The cell coupling detector 404 may be configured to identify the location of the cell coupling between the two memory cells using a location in the PRBS array of respective elements used to program the two memory cells. In some embodiments, the cell coupling detector 404 may be configured to identify a location of respective cell couplings in any suitable manner.

The cell coupling detector 404 may be configured to identify a magnitude of a respective cell coupling using the voltage value for each of the respective memory cell, the PRBS array, other suitable information or memory cell characteristics, or a combination thereof. For example, the cell coupling detector 404 may be configured to identify a magnitude of a cell coupling between two memory cells by determining a difference between a voltage value for each of the two memory cells and respective elements of the PRBS array used to program each of the two memory cells. In some embodiments, the cell coupling detector 404 may be configured to identify a magnitude of respective cell couplings in any suitable manner.

In some embodiment, the controller 104 may be configured to take corrective action in order to correct or adjust the memory cells in order to reduce or eliminate the cell couplings. In some embodiments, the controller 104 may be configured to track the cell couplings in order to adjust voltage values at respective memory cells corresponding to the cell couplings. In some embodiments, the controller 104 may be configured to correct, track, manage, or accommodate the cell couplings in any suitable manner.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 7:
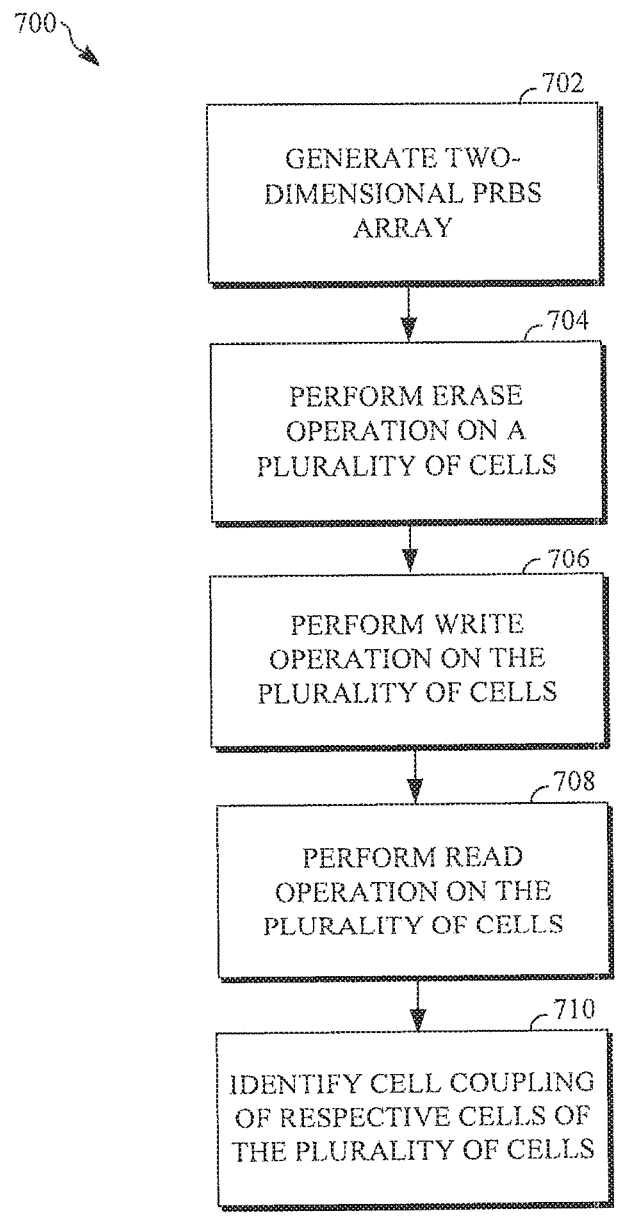
FIG. 7 is a flow diagram generally illustrating a cell coupling detection method according to the principles of the present disclosure.

FIG. 7 is a flow diagram illustrating a cell coupling detection method 700 according to the principles of the present disclosure. At 702, the method 700 generates a two-dimensional PRBS array. For example, the controller 104 may generate the PRBS array, as described. In some embodiments, the controller 104 may receive the PRBS array. At 704, the method 700 performs an erase operation on a plurality of cells. For example, the controller 104 may perform the erase operation on respective memory cells of the memory block 302-1. At 706, the method 700 performs a write operation on the plurality of cells. For example, the controller 104 performs the write operation on the respective memory cells of the memory block 302-1 using the PRBS array (e.g., using the elements of the PRBS array to program the respective memory cells with voltages representing the random data of the PRBS array). At 708, the method 700 performs a read operation on the plurality of cells. For example, the controller 104 performs the read operation on the respective memory cells of the memory block 302-1 in order to identify voltages of the respective memory cells. At 710, the method 700 identifies cell coupling of respective cells of the plurality of cells. For example, the controller 104 identifies cell couplings between respective memory cells of the memory block 302-1 using the voltages of the respective cells, the PRBS array, other suitable information or characteristics, or a combination thereof. The controller 104 may then take corrective action, as described, to address the cell couplings.

In some embodiments, a method for identifying cell coupling in a memory system includes generating a two-dimensional pseudorandom binary sequence array. The method also includes performing an erase operation on a plurality of cells of a memory block of the memory system. The method also includes performing a write operation on the plurality of cells using the two-dimensional pseudorandom binary sequence array. The method also includes performing a read operation on the plurality of cells to identify a voltage value for each cell of the plurality of cells. The method also includes identifying cell coupling between respective cells of the plurality of cells using the voltage value for each of the cells of the plurality of cells.

In some embodiments, the two-dimensional pseudorandom binary sequence array is a square array including sides of length $(2^N-1)$, wherein N is a polynomial degree. In some embodiments, each column and each row of the two-dimensional pseudorandom binary sequence array includes all possible values of the two-dimensional pseudorandom binary sequence array only once. In some embodiments, identifying cell coupling between respective cells of the plurality of cells using the voltage value for each of the cells of the plurality of cells includes identifying a location for each identified cell coupling. In some embodiments, identifying cell coupling between respective cells of the plurality of cells using the voltage value for each of the cells of the plurality of cells includes identifying a magnitude for each identified cell coupling. In some embodiments, the plurality of cells are multi-level cells. In some embodiments, some of the identified cell couplings include linear cell couplings. In some embodiments, some of the identified cell couplings include non-linear cell couplings.

In some embodiments, a controller includes a bus interface and a processor. The bus interface is in communication with one or more memory blocks of a memory system. The processor is configured to: receive a two-dimensional pseudorandom binary sequence array; perform an erase operation on a plurality of cells of a memory block of the one or more memory blocks; perform a write operation on the plurality of cells using the two-dimensional pseudorandom binary sequence array; perform a read operation on the plurality of cells to identify a voltage value for each cell of the plurality of cells; and identify cell coupling between respective cells of the plurality of cells using the voltage value for each of the cells of the plurality of cells.

In some embodiments, the two-dimensional pseudorandom binary sequence array is a square array including sides of length $(2^N-1)$, wherein N is a polynomial degree. In some embodiments, each column and each row of the two-dimensional pseudorandom binary sequence array includes all possible values of the two-dimensional pseudorandom binary sequence array only once. In some embodiments, the processor is further configured to identify a location for each identified cell coupling. In some embodiments, the processor is further configured to identify a magnitude for each identified cell coupling. In some embodiments, the plurality of cells are multi-level cells. In some embodiments, some of the identified cell couplings include linear cell couplings. In some embodiments, some of the identified cell couplings include non-linear cell couplings.

In some embodiments, a system for identifying cell coupling in a memory system includes at least one memory block and a controller. The controller is in communication with the at least one memory block and includes a pseudorandom binary sequence generator configured to generates a two-dimensional pseudorandom binary sequence array. The controller also includes a cell coupling detector configured to: perform an erase operation on a plurality of cells of the at least one memory block; perform a write operation on the plurality of cells using the two-dimensional pseudorandom binary sequence array; perform a read operation on the plurality of cells to identify a voltage value for each cell of the plurality of cells; and identify cell coupling between respective cells of the plurality of cells using the voltage value for each of the cells of the plurality of cells.

In some embodiments, the two-dimensional pseudorandom binary sequence array is a square array including sides of length $(2^N-1)$, wherein N is a polynomial degree. In some embodiments, each column and each row of the two-dimensional pseudorandom binary sequence array includes all possible values of the two-dimensional pseudorandom binary sequence array only once. In some embodiments, the plurality of cells are multi-level cells.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for identifying cell coupling in a memory system, the method comprising:
generating a two-dimensional pseudorandom binary sequence array that comprises columns and rows;
performing an erase operation on a plurality of cells of a memory block of the memory system;
performing a write operation on the plurality of cells using the two-dimensional pseudorandom binary sequence array;
performing a read operation on the plurality of cells to identify a voltage value for each cell of the plurality of cells; and
identifying cell coupling between at least two cells of the plurality of cells using the voltage value for each of the cells of the plurality of cells.

2. The method of claim 1, wherein the two-dimensional pseudorandom binary sequence array is a square array including sides of length ($2^N-1$), wherein N is a polynomial degree.

3. The method of claim 1, wherein each column and each row of the two-dimensional pseudorandom binary sequence array includes all possible values of the two-dimensional pseudorandom binary sequence array only once.

4. The method of claim 1, wherein identifying cell coupling between at least two cells of the plurality of cells using the voltage value for each of the cells of the plurality of cells includes identifying a location for each identified cell coupling.

5. The method of claim 1, wherein identifying cell coupling between at least two cells of the plurality of cells using the voltage value for each of the cells of the plurality of cells includes identifying a magnitude for each identified cell coupling.

6. The method of claim 1, wherein the plurality of cells are multi-level cells.

7. The method of claim 1, wherein some of the identified cell couplings include linear cell couplings.

8. The method of claim 1, wherein some of the identified cell couplings include non-linear cell couplings.

9. A controller comprising:
a bus interface in communication with one or more memory blocks of a memory system; and
a processor configured to:

receive a two-dimensional pseudorandom binary sequence array that comprises columns and rows;

perform an erase operation on a plurality of cells of a memory block of the one or more memory blocks;

perform a write operation on the plurality of cells using the two-dimensional pseudorandom binary sequence array;

perform a read operation on the plurality of cells to identify a voltage value for each cell of the plurality of cells; and identify cell coupling between at least two cells of the plurality of cells using the voltage value for each of the cells of the plurality of cells.

10. The controller of claim 9, wherein the two-dimensional pseudorandom binary sequence array is a square array including sides of length ($2^N-1$), wherein N is a polynomial degree.

11. The controller of claim 9, wherein each column and each row of the two-dimensional pseudorandom binary sequence array includes all possible values of the two-dimensional pseudorandom binary sequence array only once.

12. The controller of claim 9, wherein the processor is further configured to identify a location for each identified cell coupling.

13. The controller of claim 9, wherein the processor is further configured to identify a magnitude for each identified cell coupling.

14. The controller of claim 9, wherein the plurality of cells are multi-level cells.

15. The controller of claim 9, wherein some of the identified cell couplings include linear cell couplings.

16. The controller of claim 9, wherein some of the identified cell couplings include non-linear cell couplings.

17. A system for identifying cell coupling in a memory system, the system comprising:

at least one memory block; and a controller in communication with the at least one memory block, the controller including:

a pseudorandom binary sequence generator configured to generates a two-dimensional pseudorandom binary sequence array that comprises columns and rows; and a cell coupling detector configured to:

perform an erase operation on a plurality of cells of the at least one memory block;

perform a write operation on the plurality of cells using the two-dimensional pseudorandom binary sequence array;

perform a read operation on the plurality of cells to identify a voltage value for each cell of the plurality of cells; and identify cell coupling between at least two cells of the plurality of cells using the voltage value for each of the cells of the plurality of cells.

18. The system of claim 17, wherein the two-dimensional pseudorandom binary sequence array is a square array including sides of length ($2^N-1$), wherein N is a polynomial degree.

19. The system of claim 17, wherein each column and each row of the two-dimensional pseudorandom binary sequence array includes all possible values of the two-dimensional pseudorandom binary sequence array only once.

20. The system of claim 17, wherein the plurality of cells are multi-level cells.

* * * * *